United States Patent
Kieslinger et al.

(10) Patent No.: US 11,272,617 B2
(45) Date of Patent: Mar. 8, 2022

(54) ELECTRONIC PRINTED CIRCUIT BOARD ASSEMBLY FOR HIGH-POWER COMPONENTS

(71) Applicant: ZKW Group GmbH, Wieselburg (AT)

(72) Inventors: Dietmar Kieslinger, Theresienfeld (AT); Erik Edlinger, Vienna (AT); Markus Lahner, St. Pölten (AT); Wolfgang Manhart, Sachsenkam (DE)

(73) Assignee: ZKW Group GmbH, Wieselburg (AT)

( * ) Notice: Subject to any disclaimer, the term of this patent is extended or adjusted under 35 U.S.C. 154(b) by 92 days.

(21) Appl. No.: 16/971,949

(22) PCT Filed: Jan. 16, 2019

(86) PCT No.: PCT/EP2019/051011
§ 371 (c)(1),
(2) Date: Aug. 21, 2020

(87) PCT Pub. No.: WO2019/161999
PCT Pub. Date: Aug. 29, 2019

(65) Prior Publication Data
US 2021/0092846 A1 Mar. 25, 2021

(30) Foreign Application Priority Data
Feb. 26, 2018 (EP) .................................... 18158657

(51) Int. Cl.
*H05K 1/14* (2006.01)
*F21S 45/47* (2018.01)
(Continued)

(52) U.S. Cl.
CPC .............. *H05K 1/144* (2013.01); *F21S 45/47* (2018.01); *H05K 1/0203* (2013.01); *H05K 1/181* (2013.01);
(Continued)

(58) Field of Classification Search
CPC ...... H05K 1/144; H05K 1/0203; H05K 1/181; H05K 3/0061; H05K 2201/041;
(Continued)

(56) References Cited

U.S. PATENT DOCUMENTS

2006/0234528 A1  10/2006  Nakano et al.
2013/0062717 A1   3/2013  Watanabe et al.
(Continued)

FOREIGN PATENT DOCUMENTS

DE   102016209611 A1   12/2017
GB      2396056 A       6/2004

OTHER PUBLICATIONS

International Search Report for PCT/EP2019/051011, dated Mar. 15, 2019 (1 page).
(Continued)

*Primary Examiner* — Sherman Ng
(74) *Attorney, Agent, or Firm* — Eversheds Sutherland (US) LLP

(57) ABSTRACT

The invention relates to an electronic module (40) comprising at least one printed circuit board of a first type (referred to as "printed circuit board A"), which is equipped in an overlapping manner with at least one printed circuit board of a second type (referred to as "printed circuit hoard B"), printed circuit board B being equipped with at least one electronic component with specific requirements (19), and the interconnected printed circuit boards A and B forming a stepped composite printed circuit board (100, 200, 300, 400, 500). The composite printed circuit board (100, 200, 300, 400, 500) is delimited at least in some regions by end regions (16) which are formed by sections of the at least one printed circuit board A, and the composite printed circuit board (100, 200, 300, 400, 500) is placed on a heat sink (20). A fastening side (15) of the at least one printed circuit board B (Continued)

Figure 1:
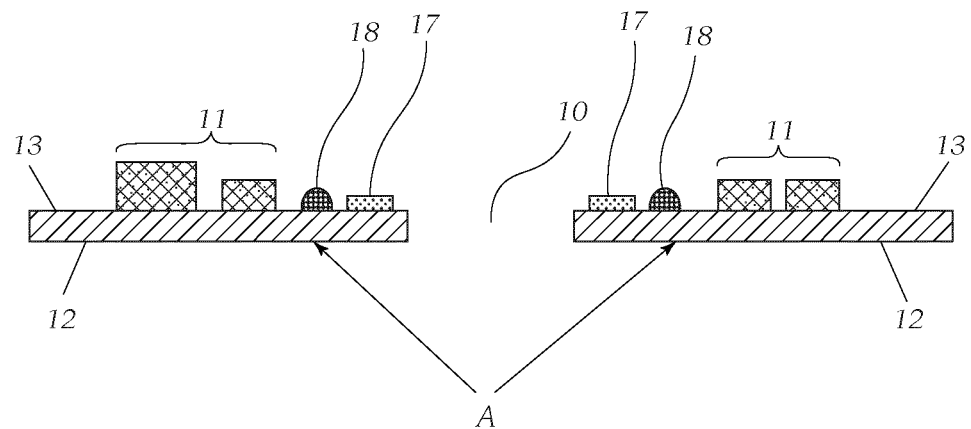

rests flat on a contact face (21) of the heat sink (20), the contact face (21) of the heat sink (20) being dimensioned and positioned such that at least part of it extends laterally beyond the fastening side (15) of the at least one printed circuit board B in each case towards the end regions (16) formed. Supporting elements (23, 24, 25, 26) are formed on the contact face (21) of the heat sink for the mechanical support of the end regions (16). The invention also relates to a method for producing such an electronic module.

13 Claims, 9 Drawing Sheets

(51) Int. Cl.
*H05K 1/02* (2006.01)
*H05K 1/18* (2006.01)
*H05K 3/00* (2006.01)

(52) U.S. Cl.
CPC ..... *H05K 3/0061* (2013.01); *H05K 2201/041* (2013.01); *H05K 2201/049* (2013.01); *H05K 2201/066* (2013.01); *H05K 2201/10113* (2013.01); *H05K 2201/10734* (2013.01); *H05K 2203/1563* (2013.01); *H05K 2203/166* (2013.01)

(58) Field of Classification Search
CPC ....... H05K 2201/049; H05K 2201/066; H05K 2201/10113; H05K 2201/10734; H05K 2203/1563; H05K 2203/166
USPC .......................................................... 361/709
See application file for complete search history.

(56) References Cited

U.S. PATENT DOCUMENTS

| | | | |
|---|---|---|---|
| 2015/0092380 A1* | 4/2015 | Hohlfeld ................ | H05K 1/11 361/783 |
| 2015/0173183 A1* | 6/2015 | Holec ..................... | H05K 3/363 361/803 |
| 2016/0192473 A1* | 6/2016 | Kasashima .......... | H05K 1/0204 361/710 |

OTHER PUBLICATIONS

Search Report for European Patent Application No. 18158657, dated Sep. 5, 2018 (1 page).

* cited by examiner

ELECTRONIC PRINTED CIRCUIT BOARD ASSEMBLY FOR HIGH-POWER COMPONENTS

The invention relates to an electronic module comprising at least one printed circuit board of a first generic type (termed "printed circuit board A"), if appropriate populated on both sides, which is populated in an overlapping manner with at least one printed circuit board of a second generic type (termed "printed circuit board B"), wherein the printed circuit board B is populated with at least one electronic component with specific requirements, and the printed circuit boards A and B, which are connected to one another, form a stepped printed circuit board composite, wherein the stepped printed circuit board composite is delimited, at least in certain regions, by end regions, which are formed by sections of the at least one printed circuit board A, and the stepped printed circuit board composite is placed on a heat sink, wherein a fastening side of the at least one printed circuit board B rests flat on a contact surface of the heat sink.

The invention additionally relates to a method for producing an electronic module according to the invention in a component placement line, wherein the electronic module comprises a stepped printed circuit board composite having at least one electronic component with specific requirements and a heat sink.

In the prior art, printed circuit boards (PCBs) are also known as printed wiring boards (PWBs) and are used to connect electrical, but above all electronic, components to one another in a space-saving and stable manner. For this purpose, printed circuit boards have conductive layers arranged on insulating layers, which are structured to form conducting tracks for interconnecting the components and are separated from one another by the insulating layers. The components can here be arranged on the surface of the printed circuit board or embedded into the printed circuit board. The progressive miniaturization of printed circuit boards for providing a large number of functionalities in compact devices leads to not insignificant constraints with regards to draining heat which is output by the components and which must be drained and radiated efficiently both for protecting the components and for protecting the printed circuit board. Particularly problematic are high-power components, such as for example components which output a particularly large amount of heat; thus for example require power transistors and LEDs (light-emitting diodes), which are used increasingly in motor-vehicle lighting engineering, a well thought-out heat management of the printed circuit board, in order to prevent overheating and associated damage of the printed circuit boards or the components.

For example, IMS printed circuit boards are used for high-power components, e.g. thermally critical components such as power transistors and LEDs. The necessary thermally relevant surface, however, is for the most part considerably smaller than the surface of the IMS flat assembly ultimately produced. This is in particular because a minimum spacing is necessary between the individual electronic components, e.g. owing to the lighting-technology requirements in the case of LEDs. For reasons of simple and tolerance-stable mounting, it is however expedient if all LEDs sit on one printed circuit board. In addition, plugs and contacts are located at a certain spacing from the high-power component on the printed circuit board for structural reasons. Furthermore, the printed circuit board is also often used as a structural component, on which, in addition to the high-power component, other components are aligned and fastened (e.g. optical components such as reflectors or primary optical elements in LED assemblies for motor-vehicle lighting devices). These alignment and fastening points necessarily lie at a certain distance from the high-power component. All of these reasons lead to IMS printed circuit board dimensions which are considerably larger than they would have to be for thermal reasons. Realizing this additional area in IMS printed circuit boards means wasting expensive material.

There are approaches of printed circuit board producers for integrating printed circuit boards for high-power components (e.g. IMS printed circuit boards) into more cost-effective printed circuit boards or printed circuit boards with different properties (e.g. in classic FR4 multilayer printed circuit boards). One approach for example follows the goal of obtaining a hybrid FR4/IMS combination printed circuit board, which on the one hand has the heat-draining behaviour of the IMS printed circuit board and at the same time has the flexibility, resolution and multilayer capability of FR4 printed circuit boards. However, the previously known solutions are not attractive in terms of price, are associated with manufacturing limits with respect to the shape and size of the IMS portion or the electronic modules based on hybrid printed circuit boards obtained are not mechanically stable enough in order to be used as a single, rigid, classic flat assembly in the further processing process (assembly, mounting, etc.).

It is therefore an object of the invention to overcome the above-mentioned disadvantages and provide an electronic module, which on the one hand fulfils all prerequisites for high-power components, and on the other hand only contains expensive printed circuit board material required for high-power components to the extent required, and can be produced in a standard placement process, e.g. in an SMT (surface mounted technology) placement process, and can be handled during further processing or mounting like a single, rigid, classic flat assembly.

This object is achieved by providing an electronic module as mentioned at the beginning, in that according to the invention, the contact surface of the heat sink is dimensioned and positioned in such a manner that it extends at least partially laterally beyond the fastening side of the at least one printed circuit board B in the direction of the end regions formed by the sections of the at least one printed circuit board A, and in that support elements, for mechanically supporting the end regions formed by the sections of the at least one printed circuit board A, are constructed on the contact surface of the heat sink.

This object is further achieved by means of a method for producing an electronic module in a component placement line, the electronic module comprising a stepped printed circuit board composite having at least one electronic component with specific requirements and a heat sink, wherein the method comprises:

populating at least one printed circuit board of a first generic type (termed "printed circuit board A"), if appropriate populated or to be populated on both sides in an overlapping manner with at least one printed circuit board of a second generic type (termed "printed circuit board B"), wherein the printed circuit board B is populated with at least one electronic component with specific requirements, to obtain a stepped printed circuit board composite, wherein the stepped printed circuit board composite is delimited, at least in certain regions, by end regions, which are formed by sections of the at least one printed circuit board A, and placing the stepped printed circuit board composite obtained onto the heat sink in such a manner that a fastening side of the at least one printed circuit board B rests flat on a contact surface of the heat sink, wherein the contact surface of the heat sink is dimensioned and positioned in such a manner that it extends at least partially laterally beyond the fastening side of the at least one printed circuit board B in each case in the direction of the end regions formed by the sections of the at least one printed circuit board A, and wherein support elements, for mechanically supporting the end regions formed by the sections of the at least one printed circuit board A, are constructed on the contact surface of the heat sink.

Thanks to the invention, an electronic module with a hybrid printed circuit board composite is created, which on the one hand is suitable for high-power components, which for the most part only contains expensive printed circuit board material required for high-power components to the extent actually required and thus is cost-optimized, and on the other hand is so mechanically stable that it can be handled in further processing (e.g. assembly, mounting, manufacturing) like a single, rigid, classic flat assembly. Thus, the advantages of two different types of printed circuit boards can be used without having to miss out on the advantage of the simple handling of classic flat assemblies: for example complex circuits and designs can be realized on inexpensive FR4 printed circuit boards used for many standard applications, whereas for applications in the high-frequency range, thermal and/or electrical prerequisites are paramount, which are fulfilled by the further generic printed circuit board type. Thanks to the invention, e.g. a narrow integration of control electronics (e.g. contacts on an FR4 printed circuit board) and a high-power component (e.g. a thermally critical LED on an IMS printed circuit board) is possible on a single mechanically stable module. The electronic module may additionally easily be produced in an existing SMT process or in a common SMT component placement line for components placed on both sides. In addition, owing to the lower metal portion, the electronic module according to the invention is lighter.

The terms used synonymously herein, "electronic component with specific requirements" and "high-power component" in this case relate to components which have specific requirements with regards to the printed circuit board or the printed circuit board substrate (termed "printed circuit board B" herein), on which they are fixed. As already mentioned above in the introduction, these may for example be components, which produce a very great deal of heat (e.g. LEDs) and therefore require a printed circuit board with high heat-draining capability (e.g. IMS printed circuit board) or with corresponding adaptation to the thermal expansion. The different base materials for printed circuit boards and the properties thereof and the requirements of the printed circuit board properties for the respective high-power components are sufficiently well-known for a person skilled in the field. Comprehensive information about printed circuit board base materials and corresponding high-power components can for example be drawn from the internet links http://www.contag.de/uploads/pi_ti/materialien_b.pdf and http://wiki.fe.de/index.php/Basismaterialarten. Representative examples for high-power components known to the person skilled in the art from the field of motor-vehicle lighting technology including associated printed circuit boards and a reason are reproduced in the following Table 1:

TABLE 1

| High-power component | Printed circuit board material | Reason |
|---|---|---|
| Power transistor | Al-IMS | Heat dissipation, less expensive than Cu-IMS |
| HF/processor | HDI-FR4 | Integration density |
| High-power LED (ceramic package) | Cu-IMS | Heat dissipation, lower mismatching in the case of thermal expansion (CTE) than for Al-IMS |
| Semiconductor laser | Ceramic | Exact adaptation in the event of thermal expansion (CTE adaptation), high thermal conductivity, high lifespan and reliability |
| Microwave amplifier (radar) | PTFE (Teflon ®) | High-frequency properties |
| Valves, pumps, measuring channels, vents | Microfluidic printed circuit boards, e.g. ALine, Elveflow | Chemistry/optics/electronics integration |

In a variant, the printed circuit board A may be an FR4 printed circuit board. In a different variant, the printed circuit board B may be an IMS printed circuit board (metal core printed circuit board). In a specific variant, the printed circuit board A may be an FR4 printed circuit board and the printed circuit board B may be an IMS printed circuit board (metal core printed circuit board).

The electronic component with specific requirements may in particular be an optoelectronic component. The optoelectronic component may for example be a laser diode, an LED, an LED arrangement, a photodiode or a DLP component.

The method for producing the electronic module may be carried out in an SMT (surface mounted technology) component placement line.

In a variant, the contact surface of the heat sink is dimensioned and positioned in such a manner that it essentially extends up to the end regions formed by the sections of the at least one printed circuit board A. The end regions of the contact surface of the heat sink and the end regions of the printed circuit board A may be flush with one another at least in certain regions. In a development of the invention, the contact surface of the heat sink and the surface of the stepped printed circuit board composite are essentially congruent with regards to their surface shape and surface area.

In variants, which are simple to realize, the at least one printed circuit board A has at least one recess and the at least one printed circuit board B is connected in an overlapping manner to the at least one printed circuit board A such that in each case, a printed circuit board B in each case covers a recess of the printed circuit board A at least in certain regions, preferably completely.

Preferably, the at least one recess is essentially window-shaped, i.e. the border of the recess is entirely delimited by the printed circuit board A. The shape of the window-shaped recess can be chosen freely and may for example be square, rectangular, quadrilateral, round, rounded, etc. Typically, however, the recess is rectangular or square. In this subvariant, a particularly mechanically stable electronic module is obtained. In addition, the printed circuit boards A and B may contact one another in a wide range of ways and enable complex designs and contacting.

In a variant, the at least one printed circuit board A has exactly one recess, wherein exactly one printed circuit board B is connected in an overlapping manner to one of the at least one printed circuit board A such that the printed circuit board B covers the recess of the printed circuit board A at least in certain regions, preferably completely. Preferably, the printed circuit board B covers the recess of the printed circuit board A completely. Preferably, the stepped printed circuit board composite has exactly one printed circuit board A with exactly one recess, wherein exactly one printed circuit board B is connected at overlapping width to the printed circuit board A in such a manner that the printed circuit board B covers the recess of the printed circuit board A completely.

For example, the printed circuit board A (e.g. an FR4 printed circuit board) is populated with the printed circuit board B (e.g. an IMS printed circuit board) in such a manner that the printed circuit board B covers the window-shaped recess and overlaps with the printed circuit board A along the boundary line of the recess. The high-power component (e.g. an LED arrangement) arranged on the printed circuit board B is arranged and positioned in such a manner in this case, that it extends through the recess in the printed circuit board A (e.g. in the case of an LED arrangement fixed on the printed circuit board B, the LED shines through the recess in the printed circuit board A).

In certain variants, the (at least one) recess may be essentially U-shaped. In specific variants, two or more mutually spaced printed circuit boards A may be connected in an overlapping manner to one printed circuit board B in each case, so that a printed circuit board composite stepped in the longitudinal direction with printed circuit boards A and B connected in a serially alternating manner is obtained, wherein the two or more printed circuit boards A are essentially arranged in one plane and the printed circuit board(s) B are arranged essentially in one plane, wherein the end regions of the printed circuit board composite are formed by a section of a respectively end-placed printed circuit board A. These two variants which are mentioned constitute specific embodiments, which may be used in the case of specific designs. The above-described variant with the window-shaped recess is preferred, however, as a particularly mechanically stable electronic module is obtained therewith, and furthermore, the printed circuit boards A and B contact one another in a wide range of ways and enable complex designs and contacting.

The support elements may be applied on the contact surface of the heat sink or moulded on the contact surface of the heat sink, if appropriate in one piece, wherein the support elements are set up to support the end regions of the printed circuit board composite formed by the sections of the at least one printed circuit board A.

In certain design variants, the support elements may be realized with a "gap filler" in the form of structural adhesive, which is applied in the form of adhesive dots on the contact surface of the heat sink. These adhesive dots mechanically support/stabilize the end regions of the printed circuit board composite formed by the sections of the at least one printed circuit board A. This variant appeals for example if no significant external forces act at the end regions of the at least one printed circuit board A and the fastening surface of the at least one printed circuit board B (e.g. an IMS printed circuit board) is already fastened on the contact surface of the heat sink using an adhesive (e.g. a thermally conductive adhesive).

In other design variants, steps may be moulded as support elements on the contact surface of the heat sink in the region of the end regions of the printed circuit board composite. The end regions of the printed circuit board composite sit on these steps and are mechanically supported/stabilized. The configuration of the support elements in the form of steps appears to constitute a simple solution, but has the disadvantage, that the step height must be adapted exactly to the placement process (e.g. soldering paste thickness, adhesive quantity, shrinkage in the case of reflow soldering, etc.). The implementation may prove to be difficult in practice. When using thermal interface materials (TIMs), such as e.g. when using thermally conductive adhesive (TIM adhesive) between the printed circuit board B and the heat sink, the TIM thickness must additionally also be taken into account in the determination of the step height; this variant is therefore only practical to a limited extent when using TIM.

In particularly advantageous design variants, washers made from printed-circuit-board-B material are applied as support elements on the contact surface of the heat sink in the region of the end regions of the printed circuit board composite formed by the sections of the at least one printed circuit board A, wherein the end regions of the printed circuit board composite sit on the washers and are supported by the same, and wherein the printed-circuit-board-B material for the washers is chosen from the same batch, from which the printed-circuit-board-B material for the at least one printed circuit board B originates. This variant has the advantage that the same joining technology can be used for the washers as for the printed circuit board B. Tolerances in the thickness of the printed circuit board B and long-term deviations in the placement process can therefore be overcome in a simple manner, as the printed-circuit-board-B material of the washers originates from the same batch as the printed-circuit-board-B material of the printed circuit board B.

In a particularly advantageous development of the previously mentioned variant, the at least one printed circuit board A has alignment holes, and the washers are positioned on the contact surface of the heat sink below the alignment holes of the at least one printed circuit board A, so that the surface regions of the respective washers are exposed by the alignment holes. Although the placer may call upon registration marks/holes on the printed circuit board A in the manner known per se for the lateral positioning, the z position results from the surface of the printed circuit board B, on which the high-power component is positioned. All alignment holes may be arranged on the less expensive printed circuit board A, which is why the more expensive printed circuit board B can be kept very small. An important advantage of this development additionally lies in the fact that an exact z referencing and thus a highly precise positioning of the at least one high-power component is enabled. A highly precise positioning is of high importance in particular in the case of optoelectronic high-power components, e.g. LEDs, for lighting applications, e.g. in motor-vehicle headlamp applications. The achievable placement accuracy of the hybrid stepped printed circuit board composite is therefore the same as in the case of "normal" monolithic printed circuit boards.

In certain design variants, it may be provided that the support elements are set up to dissipate thermal energy from the at least one printed circuit board A to the heat sink and/or to enable a potential equalization between the at least one printed circuit board A and the heat sink. This can be realized by the choice of appropriate materials for the support elements, e.g. by thermally and/or electrically conductive materials such as copper or aluminium.

For further mechanical stabilization, the end regions of the printed circuit board composite formed by the sections of the at least one printed circuit board A can be fixed on the support elements, e.g. by adhesive bonding.

In certain embodiments, the at least one printed circuit board A and the at least one printed circuit board B are contacted with one another in their overlap region by means of ball grid array (BGA) technology. BGA contacting technology is sufficiently well-known to a person skilled in the field and allows a higher number of connections and improved heat transport. The solder balls ("balls") used in BGA technology can in this case be applied in the manner known per se to contact pads, which are provided, on one of the printed circuit boards to be connected, for the most part on the printed circuit board B. Alternatively, the solder balls can also be applied to the contact pads by application with a doctor blade of solder paste and subsequent melting in a reflow process, after which the soldering paste contracts during cooling to form solder balls. A further known method for applying solder balls is the individual application of prefabricated BGA solder balls onto the contact pads of the printed circuit board in a placement machine with the aid of mini nozzles.

As described herein, the invention relates to a method for producing an electronic module according to the invention. In a first preferred variant of the method, this comprises the following steps:

a) providing at least one printed circuit board B with a placement side (top) and a heat dissipation side (bottom), facing away from the placement side, and providing at least one electronic component with specific requirements, b) placing (top-up) and fixing the at least one electronic component with specific requirements on the placement side of the at least one printed circuit board B and subsequently turning the printed circuit board B, c) providing at least one printed circuit board A with a first placement side (top) and a second placement side (bottom), facing away from the first placement side, and providing electronic component elements, d) placing (top-up) and fixing electronic component elements on the first placement side of the at least one printed circuit board A and subsequently turning the printed circuit board A, e) placing (bottom-up) and fixing electronic component elements on the second placement side of the at least one printed circuit board A and placing (bottom-up) and fixing the at least one populated printed circuit board B from step b) on the second placement side of the at least one printed circuit board A in an overlapping manner, to obtain a stepped printed circuit board composite, wherein the stepped printed circuit board composite is delimited at least in certain regions by end regions, which are formed by sections of the at least one printed circuit board A, and f) placing the stepped printed circuit board composite obtained onto the heat sink in such a manner that the heat dissipation side of the at least one printed circuit board B rests flat on a contact surface of the heat sink, wherein the contact surface of the heat sink is dimensioned and positioned in such a manner that it extends at least partially laterally beyond the heat dissipation side of the at least one printed circuit board B in the direction of the end regions formed by the sections of the at least one printed circuit board A, and support elements, for mechanically supporting the end regions formed by the sections of the at least one printed circuit board A, are constructed on the contact surface of the heat sink.

A further, but less preferred variant of the method according to the invention comprises the following steps:

g) providing at least one printed circuit board A with a first placement side (top) and a second placement side (bottom), facing away from the first placement side, and providing electronic component elements, h) placing (bottom-up) and fixing electronic component elements on the second placement side of the at least one printed circuit board A, i) providing at least one printed circuit board B with a placement side (top) and a heat dissipation side (bottom), facing away from the placement side, j) placing (bottom-up) and fixing the at least one printed circuit board B on the second placement side of the at least one printed circuit board A in an overlapping manner, to obtain a stepped printed circuit board composite, wherein the stepped printed circuit board composite is delimited at least in certain regions by end regions, which are formed by sections of the at least one printed circuit board A, and subsequently turning the stepped printed circuit board composite, k) placing (top-up) and fixing at least one provided electronic component with specific requirements on the placement side of the at least one printed circuit board B and electronic component elements on the first placement side of the at least one printed circuit board B of the stepped printed circuit board composite from step j), to obtain a stepped printed circuit board composite populated on both sides, and l) placing the stepped printed circuit board composite obtained onto the heat sink in such a manner that the heat dissipation side of the at least one printed circuit board B rests flat on a contact surface of the heat sink, wherein the contact surface of the heat sink is dimensioned and positioned in such a manner that it extends at least partially laterally beyond the heat dissipation side of the at least one printed circuit board B in each case in the direction of the end regions formed by the sections of the at least one printed circuit board A, and support elements, for mechanically supporting the end regions formed by the sections of the at least one printed circuit board A, are constructed on the contact surface of the heat sink.

Advantageously in step k), the positioning of the at least one electronic component with specific requirements on the printed circuit board B takes place with the aid of reference marks positioned on the at least one printed circuit board A.

A further subject of the invention relates to an electronic module, which is produced according to the method according to the invention described herein.

A further subject of the invention additionally relates to an illumination device for a motor vehicle, particularly a motor-vehicle headlamp, comprising an electronic module according to the invention and as disclosed herein.

A further subject of the invention is the use of an electronic module according to the invention as disclosed herein as or in an illumination device for a motor vehicle.

The term "motor vehicle" (KFZ) relates to single- or multi-track motorized land-based vehicles, such as motorcycles, cars, lorries and the like.

The illumination device for a motor vehicle may be a motor-vehicle headlamp, a rear lamp or a motor-vehicle interior lamp or exterior lamp. The motor-vehicle headlamp is built in accordance with headlamp build principles which are known per se and typically comprises a housing with a light emission aperture, which is covered with a diffusing lens, wherein, according to the invention, at least one electronic module according to the invention is arranged in the housing.

In certain variants, the motor-vehicle headlamp has the form of a front headlamp. The structure of a front headlamp is known to the relevant person skilled in the art. Front headlamps often comprise a plurality of light modules, e.g. a daytime running light unit, a dipped beam unit, a main beam unit, an indicator, etc. Accordingly, the respective light modules of the front headlamp may form the light distribution of a dipped beam, a main beam, a daytime running light, an indicator, etc. The light modules for front headlamps mentioned may comprise an electronic module according to the invention, for example having an LED arrangement as high-power component and functioning as light source.

In other variants, the motor-vehicle headlamp has the form of a rear lamp. The structure of a rear lamp is known to the relevant person skilled in the art. Rear lamps often comprise a plurality of light modules, e.g. a rear light unit, a brake light unit, an indicator unit, etc. Accordingly, the respective light modules of the rear lamp may form the light distribution of a rear light, a brake light, an indicator, etc. The light modules for rear lamps mentioned may comprise an electronic module according to the invention, for example having an LED arrangement as high-power component and functioning as light source.

The electronic module according to the invention may, in further variants, also be a component of a standalone motor vehicle lamp, e.g. a parking light, which apart from the parking light function, contains no further light functions or light modules. It is advantageous for this, if the standalone motor-vehicle lamp comprises a housing with a light emission aperture, which is covered with a cover plate, wherein at least one electronic module according to the invention is arranged in the housing, for example with an LED arrangement as high-power component and functioning as light source. The standalone motor-vehicle lamp may e.g. be realized as a standalone front lamp, as a standalone rear lamp, as standalone side marker lamp or as motor-vehicle interior lamp.

Figure 3:
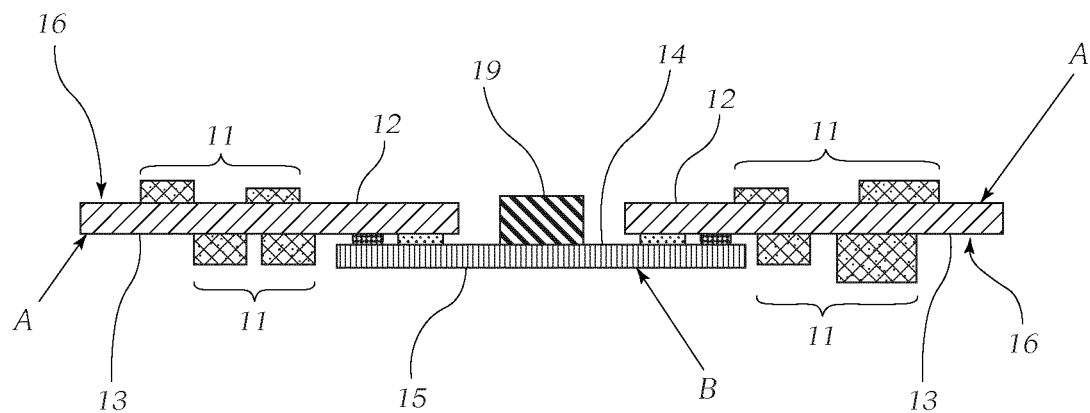
Figure 4:
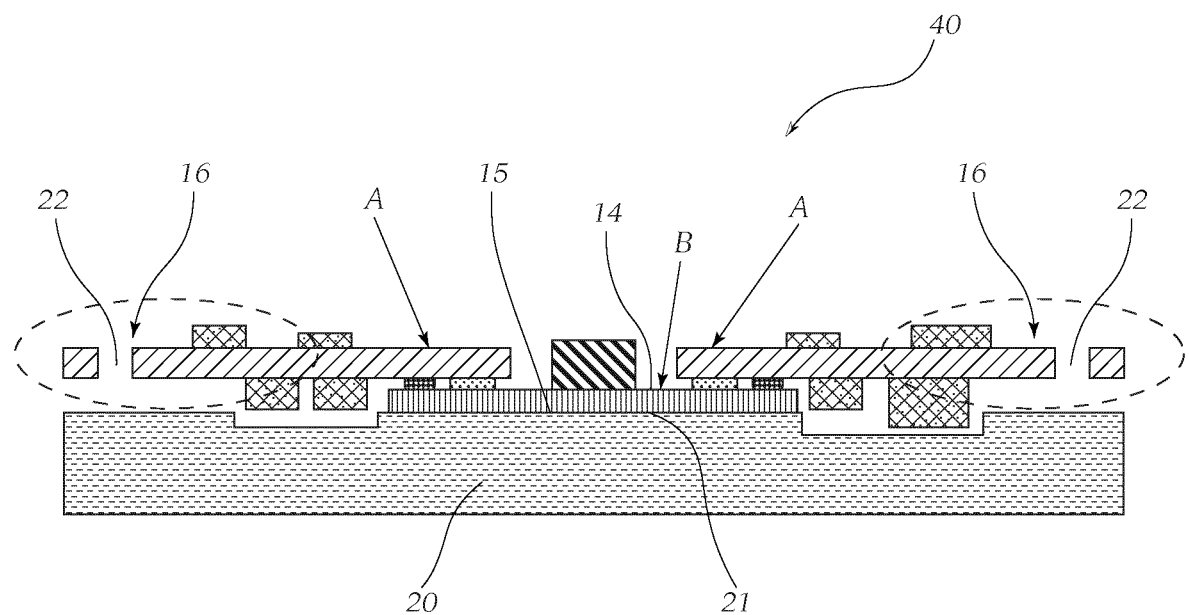
Figure 5:
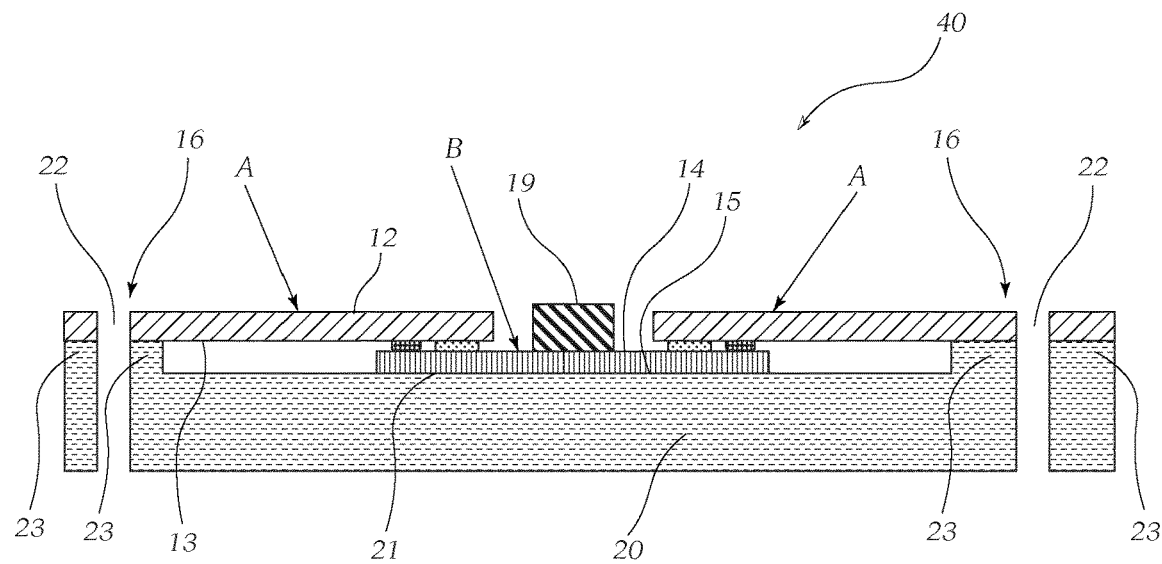
Figure 6:
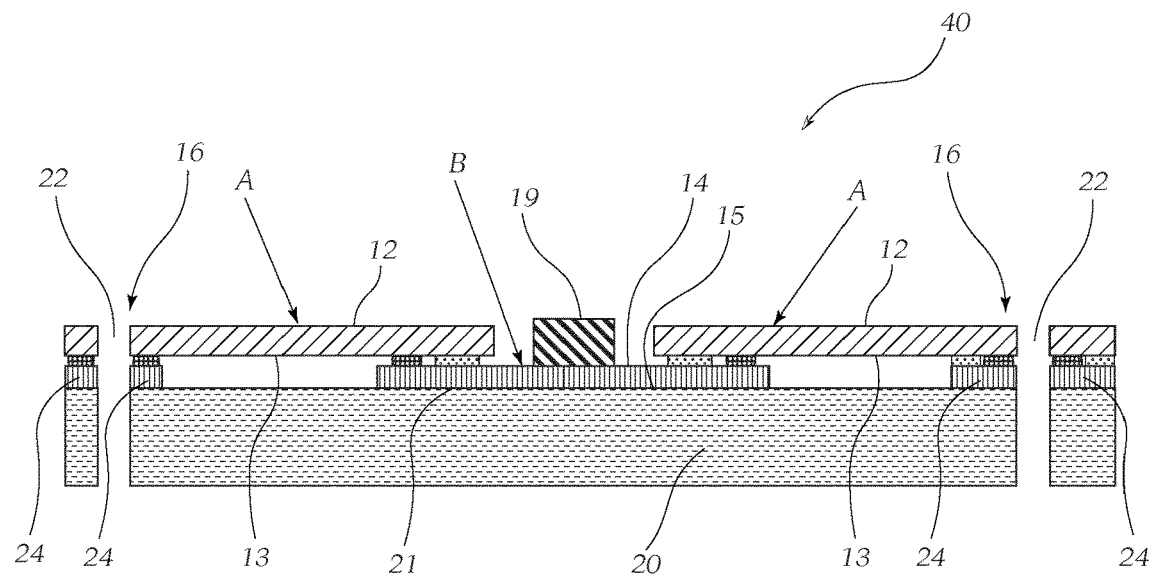
Figure 7:
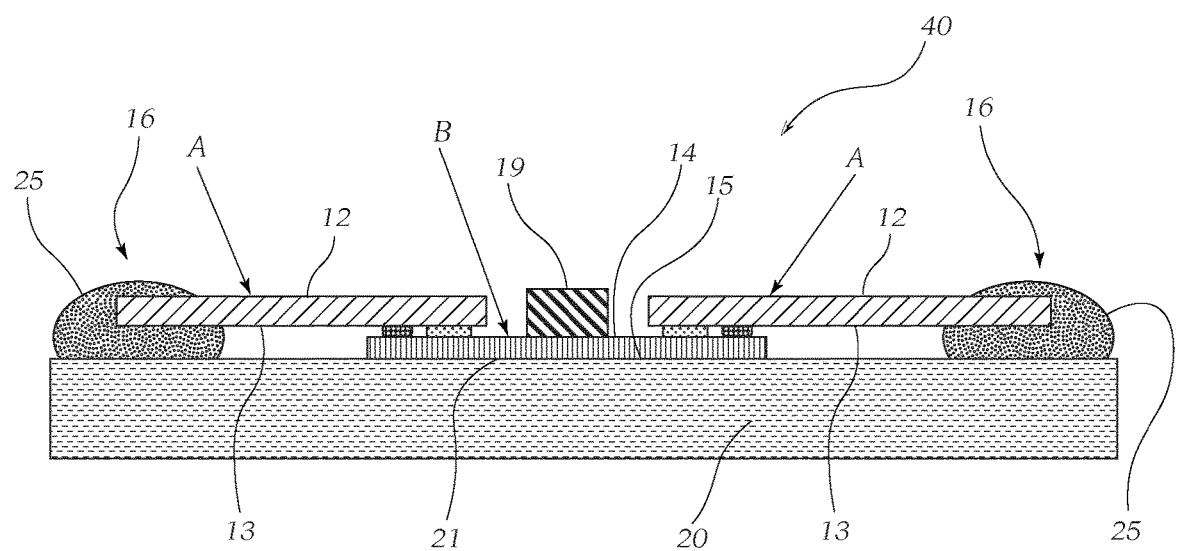
Figure 8:
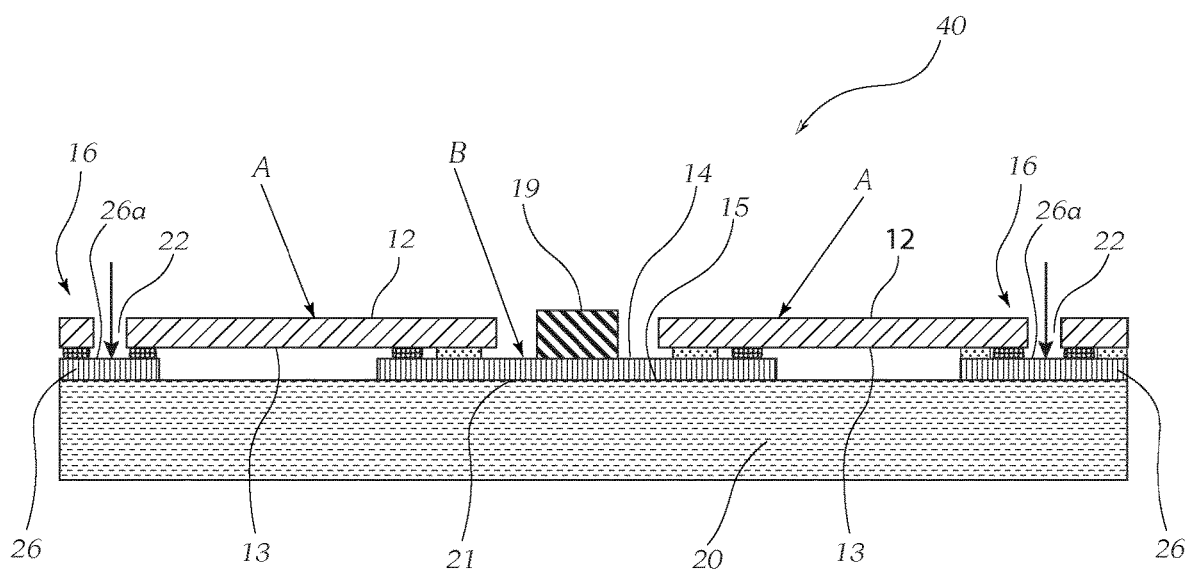
Figure 9:
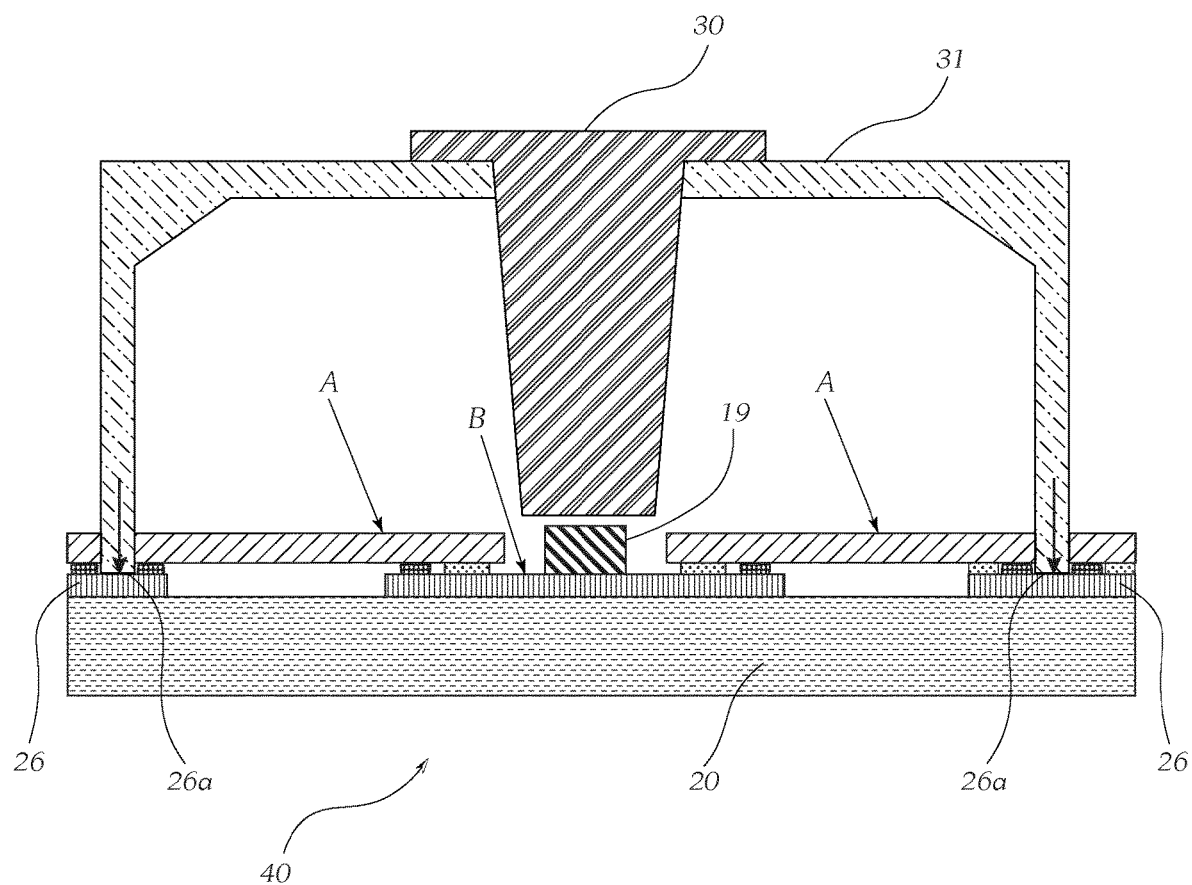
Figure 10:
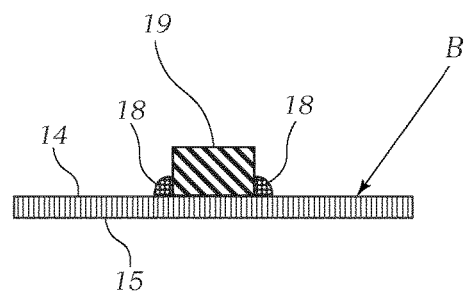
Figure 11:
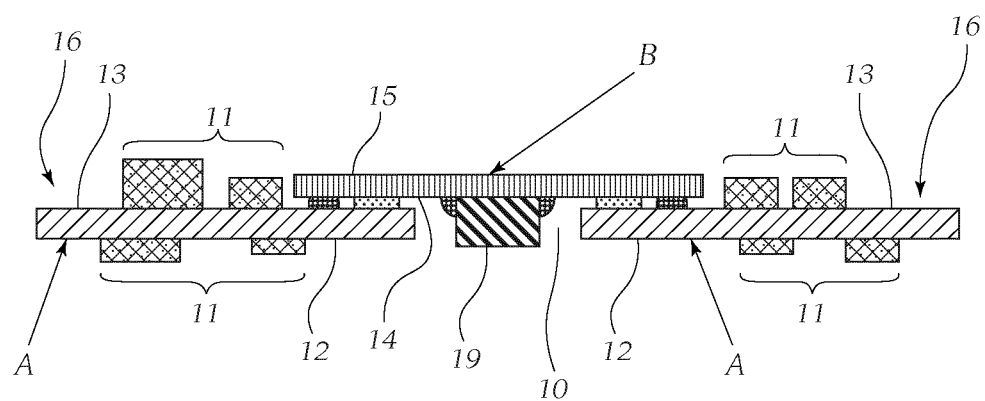
Figure 12:
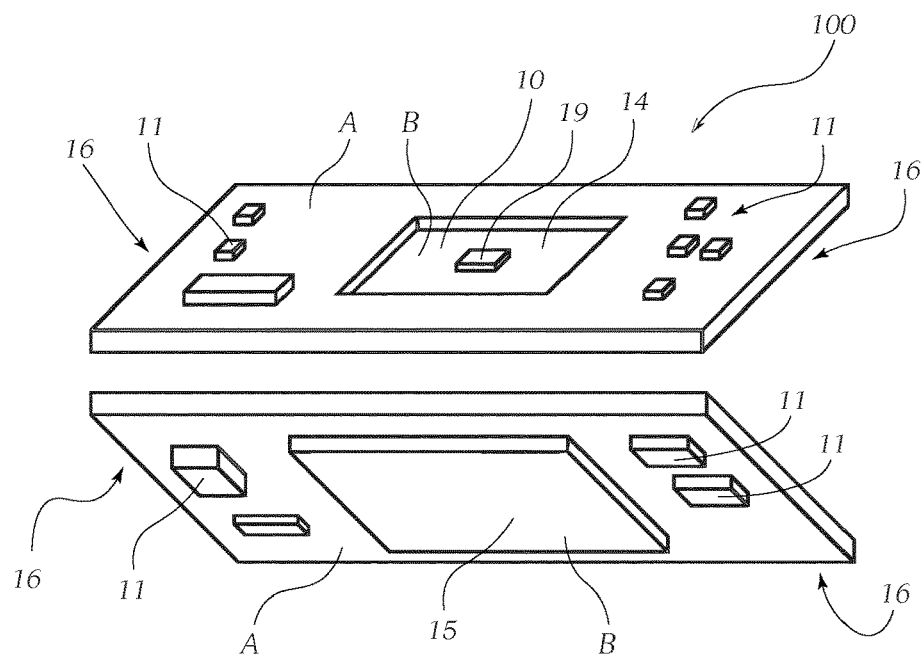
Figure 13:
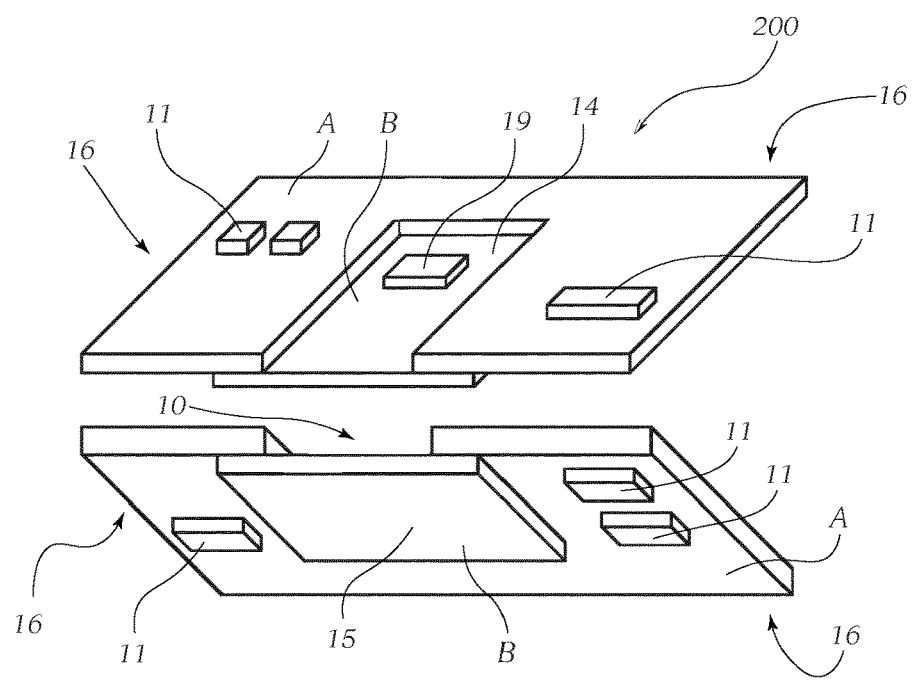
Figure 14:
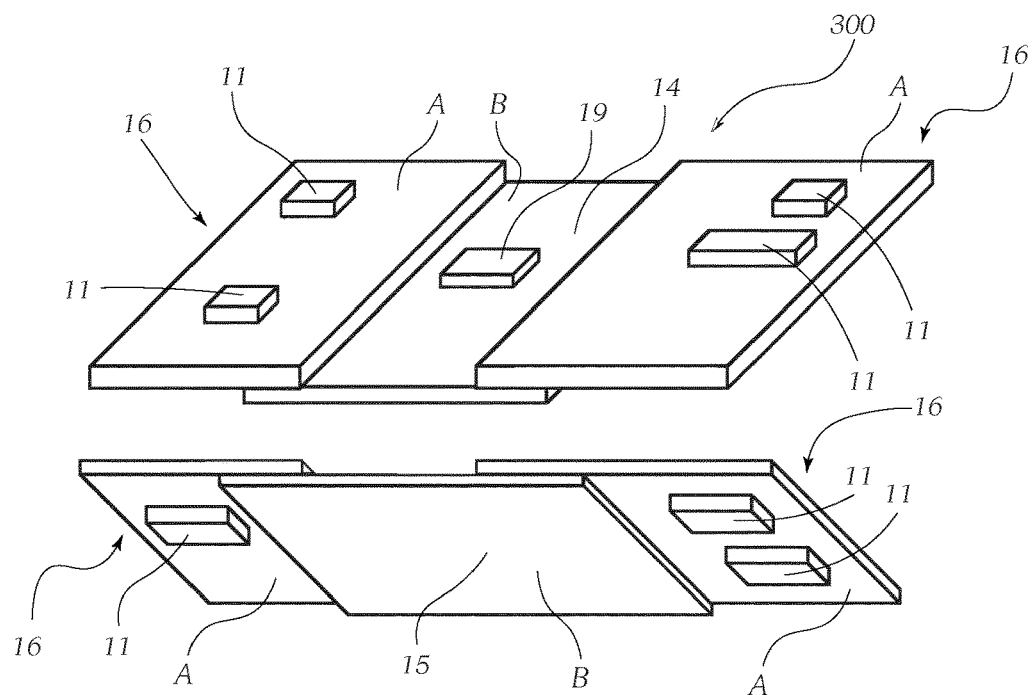
Figure 15:
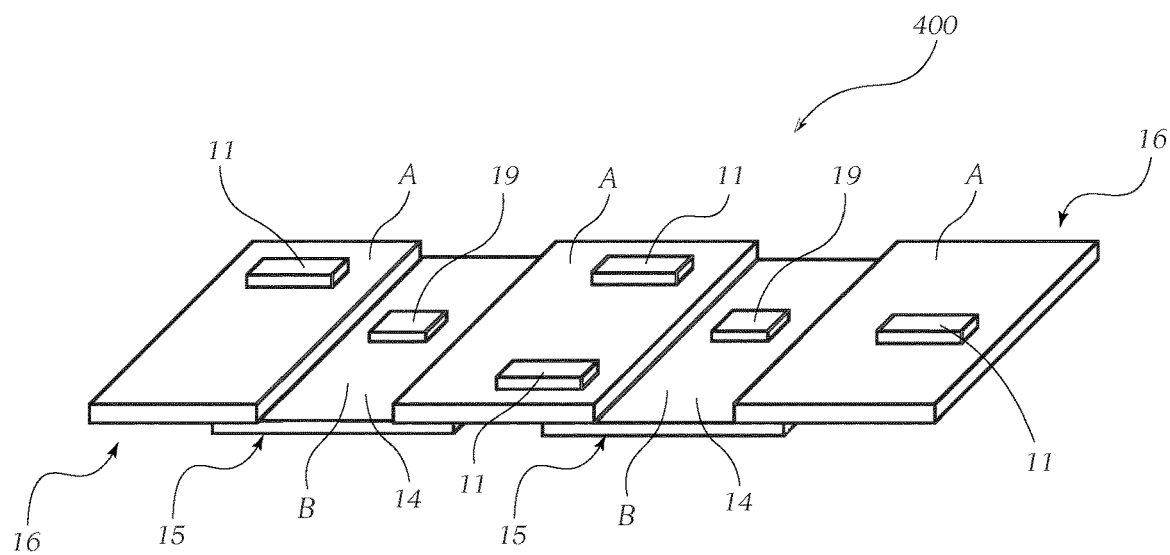
Figure 16:
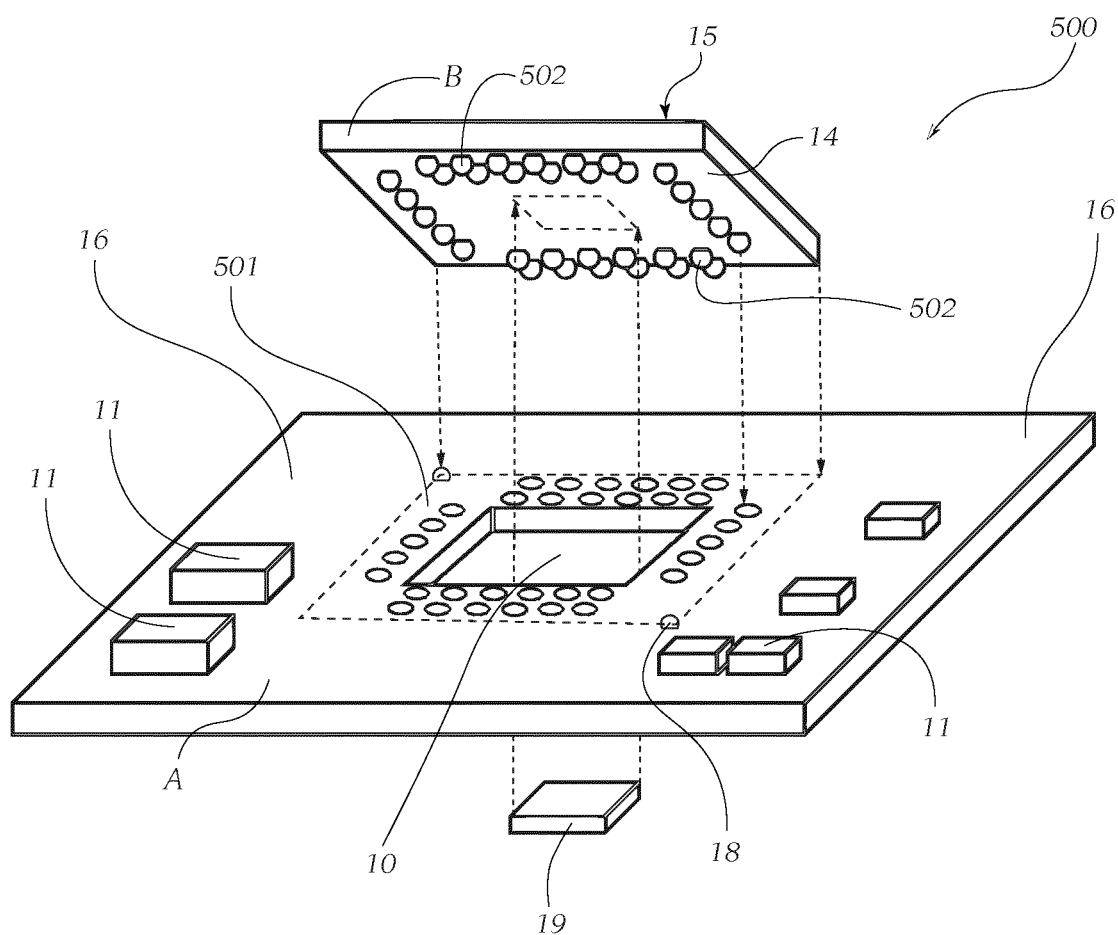

The invention including further advantages is described in more detail in the following on the basis of non-limiting examples and attached drawings, wherein in the drawings:

FIG. 1-FIG. 4 show a method for producing an electronic module according to the invention, FIG. 5 shows a variant of the mechanical support of the end regions of the printed circuit board composite by the heat sink, FIG. 6 shows a further variant of the mechanical support of the end regions of the printed circuit board composite by the heat sink, FIG. 7 shows a further variant of the mechanical support of the end regions of the printed circuit board composite by the heat sink, FIG. 8 shows a further variant of the mechanical support of the end regions of the printed circuit board composite by the heat sink and shows the option of z referencing, FIG. 9 shows the variant from FIG. 8, supplemented by a primary optical unit and a holding frame for the primary optical unit, FIG. 10 and FIG. 11 show a further, alternative method for producing an electronic module according to the invention, FIG. 12 shows a schematic illustration of a structure of the printed circuit board composite of the electronic module according to the invention, FIG. 13 shows a schematic illustration of a further structure of the printed circuit board composite of the electronic module according to the invention, FIG. 14 shows a schematic illustration of a further structure of the printed circuit board composite of the electronic module according to the invention, FIG. 15 shows a development of the structure from FIG. 14, and FIG. 16 shows a schematic illustration of a further structure of the printed circuit board composite of the electronic module according to the invention using ball grid array (BGA) technology.

It is understood that the embodiments and variants described here are merely used for illustration and are not to be considered as limiting for the invention; but rather all configurations, which the person skilled in the art may find on the basis of the description, fall within the protective scope of the invention, wherein the protective scope is determined by the claims.

In the figures, for the purposes of simpler explanation and illustration, the same reference numbers are used for the same or comparable elements. The reference numbers used in the claims should furthermore merely facilitate the readability of the claims and the understanding of the invention and in no way have a character impairing the protective scope of the invention.

In the variants and examples described in FIGS. 1-16, the printed circuit board of a first generic type (termed "printed circuit board A" or labelled with "A" in FIGS. 1-16) may be an FR4 printed circuit board. The printed circuit board of a second generic type (termed "printed circuit board B" or labelled with "B" in FIGS. 1-16) may be an IMS printed circuit board. The high-power component may be an optoelectronic component, such as for example a laser diode, an LED, an LED arrangement, a photodiode or a DLP component. Placing and fixing the individual components and component elements to form a flat assembly takes place using SMT component placement technologies, which are sufficiently well-known and used as standard, including by applying soldering paste and reflow soldering or applying adhesive dots.

FIG. 1-FIG. 4 schematically show a first method for producing an electronic module according to the invention in a standard SMT component placement line. The method variant shown in FIG. 1-FIG. 4 in this case comprises the following steps:

First step: Providing a printed circuit board A, which has a first placement side 12 (*top*) and a second placement side 13 (bottom) facing away from the first placement side 12. Furthermore, various electronic component elements 11 are provided for populating the printed circuit board A. FIG. 1 shows a vertical section through a printed circuit board A, which has a recess 10 in the middle.

Second step: Placing (bottom-up) and fixing various electronic component elements 11 on the second placement side 13 of the printed circuit board A by means of reflow soldering. The second placement side 13 of the printed circuit board A is additionally provided with soldering paste 17 and with adhesive 18 for the subsequent fixing of the printed circuit board B. The printed circuit board A obtained in the second step, which is populated with the component elements 11 on one side, is illustrated in FIG. 1.

Third step: Next, a printed circuit board B is provided, which has a placement side 14 (*top*) and a fastening side 15 (bottom) facing away from the placement side 14.

Figure 2:
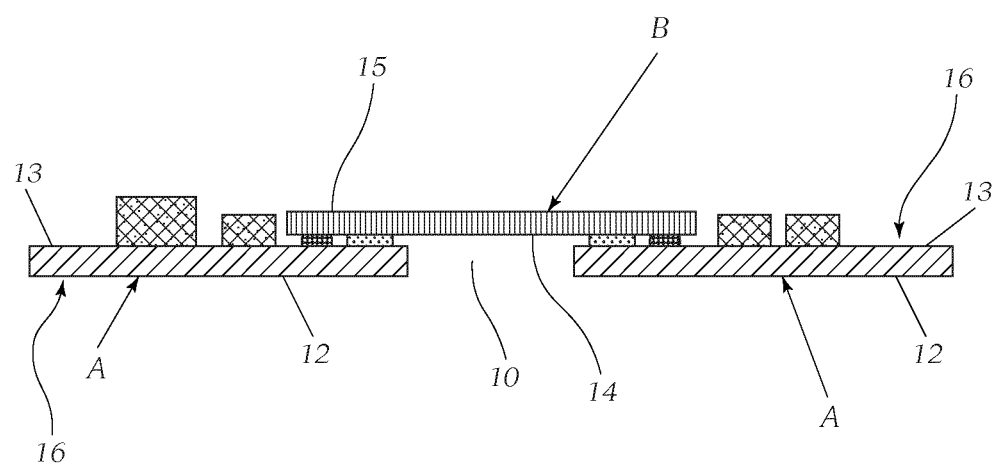

Fourth step: Placing (bottom-up) and fixing the printed circuit board B on the second placement side 13 of printed circuit board A in an overlapping manner. In this case, as is illustrated in FIG. 2, a stepped printed circuit board composite is obtained from the printed circuit board A and the printed circuit board B, in which the recess 10 of the printed circuit board A is covered by the printed circuit board B. Due to the bottom-up placement of the printed circuit board B, the placement side 14 faces the placement side 13 or the recess 10; the fastening side 15 correspondingly faces away. The stepped printed circuit board composite is, as can be seen in FIG. 2, delimited by end regions 16, which are formed by sections of the printed circuit board A. The stepped printed circuit board composite obtained in the fourth step is subsequently turned, as is conventional in double-sided placement.

Fifth step: Placing (top-up) and fixing a provided electronic component with specific requirements (in the following termed a high-power component 19) on the placement side 14 of the printed circuit board B and electronic component elements 11 on the first placement side 12 of the printed circuit board B of the stepped printed circuit board composite. In this case, a stepped printed circuit board composite, which is populated on both sides, is obtained, which is illustrated in FIG. 3. The high-power component 19 may, as already mentioned previously, be an optoelectronic component, such as for example a laser diode, an LED, an LED arrangement, a photodiode or a DLP component. In the case of an LED, this shines through the recess 10 of the printed circuit board A.

Sixth step: Placing the populated and stepped printed circuit board composite obtained in the preceding steps (see structure in FIG. 3) onto a heat sink 20. This takes place in that the printed circuit board composite is fastened flat on a contact surface 21 of the heat sink 20 using the fastening side 15 of the printed circuit board B, so that the fastening side 15 rests on the contact surface 21 (cf. FIG. 4). The contact surface 21 of the heat sink 20 is dimensioned such and is positioned such that it extends laterally beyond the fastening side 15 of the printed circuit board B in each case in the direction of the end regions 16 formed by the sections of the printed circuit board A. In the illustration shown in FIG. 4, the contact surface 21 extends laterally essentially up to the outermost ends of the end regions 16. The contact surface 21 may also have indentations, so that the component elements fastened on the second placement side 13 of the printed circuit board A find space. The printed circuit board A has alignment holes 9, as is common, for lateral positioning of the individual component elements 11 and the high-power component 19. As can now be seen very well in FIG. 4, the end regions 16 of the printed circuit board A are suspended in the air and are therefore exposed to damage due to impacts or vibrations. The region of the end regions 16 at risk from vibrations and impacts is indicated by the dashed frames. According to the invention, support elements are now formed on the contact surface 21 of the heat sink 20 for mechanically supporting the end regions 16, which are formed by the sections of the printed circuit board A and at risk from impacts and vibrations, (cf. exemplary designs in FIGS. 5-9), as a result of which an electronic module 40 with a hybrid printed circuit board according to the invention is obtained.

Various exemplary variants for support elements of this type are shown in the following FIGS. 5-9. These show a simplified illustration of the structure of the electronic module 40 from FIG. 4 with various variants of the support elements.

A first variant of the mechanical support of the end regions 16 of the printed circuit board composite is shown in FIG. 5. In this variant, steps 23 are moulded on the contact surface 21 of the heat sink as support elements. The steps 23 are moulded in one piece on the heat sink. The printed circuit board A rest in their end regions 16 with their second placement side 13 on the steps 23, as a result of which the end regions 16 are mechanically stabilized and supported. The end regions 16 can be fixed on the steps 23, for example using an adhesive.

FIG. 6 shows a further variant of the mechanical support of the end regions 16 of the printed circuit board composite. In this variant, washer-shaped steps 24 are fastened on the contact surface 21 of the heat sink as support elements. The printed circuit board A rest in their end regions 16 with their second placement side 13 on the washers 24, as a result of which the end regions 16 are mechanically stabilized and supported. The washers 24 may be manufactured from the same material (e.g. IMS material) as the printed circuit board B (e.g. an IMS printed circuit board) and have the same thickness; preferably the washers 24 and the printed circuit board B originate from the same batch, in order to overcome tolerances in the thickness and long-term deviations in the placement process. The washers 24 may in particular be manufactured from a material which is able to dissipate thermal energy from the printed circuit board A to the heat sink 20 and/or to enable potential equalization between the printed circuit board A and the heat sink. For these purposes, the washers 24 may be manufactured from a thermally and/or electrically conductive material, e.g. copper or aluminium.

FIG. 7 shows a further variant of the mechanical support of the end regions 16 of the printed circuit board composite. In this variant, the support elements may be realized with a "gap filler" in the form of structural adhesive, which is applied in the form of adhesive dots 25 on the contact surface 21 of the heat sink 20. These adhesive dots 25 mechanically support/stabilize the end regions 16 of the printed circuit board composite formed by the sections of the printed circuit board A. This variant appeals for example if no significant external forces act at the end regions 16 of the printed circuit board A and the fastening surface 15 of the printed circuit board B (e.g. an IMS printed circuit board) is already fastened on the contact surface 21 of the heat sink 20 using an adhesive (e.g. a thermally conductive adhesive).

FIG. 8 shows a further variant of the mechanical support of the end regions 16 of the printed circuit board composite by the heat sink 20 and in addition shows the option of z referencing. Similarly to the variant described in FIG. 6, in this variant, washer-shaped steps 26 are likewise fastened on the contact surface 21 of the heat sink 20 as support elements. The printed circuit board A rest in their end regions 16 with their second placement side 13 on the washers 26, as a result of which the end regions 16 are mechanically stabilized and supported. The washers 26 are in this example manufactured from the same material (e.g. IMS material) as the printed circuit board B (e.g. an IMS printed circuit board) and essentially have the same thickness; preferably the washers 26 and the printed circuit board B originate from the same batch, in order to overcome tolerances in the thickness and long-term deviations in the placement process. The printed circuit board A has above-described alignment holes 22, and the washers 26 are positioned on the contact surface 21 of the heat sink 20 below the alignment holes 22 of the printed circuit board A, so that surface regions 26a of the respective washers 26 are exposed by the alignment holes 22. Although the placer may call upon the alignment holes 22 on the printed circuit board A in the manner known per se for the lateral positioning, the z position results from the surface of the printed circuit board B, on which the high-power component 19 is positioned. The exposed surface region 26a of the respective washer 26 may therefore be called upon for z referencing (illustrated by the vertical arrows in FIG. 8). As shown in FIG. 8, the alignment holes 22 are arranged on the less expensive printed circuit board A, which is why the more expensive printed circuit board B can be kept very small. An additional and important advantage of this variant lies in particular in the fact that an exact z referencing and thus a highly precise positioning of the high-power component 19 is enabled. A highly precise positioning is of high importance in particular in the case of optoelectronic high-power components, e.g. LEDs, for lighting applications, e.g. in motor-vehicle headlamp applications. The achievable placement accuracy of the hybrid stepped printed circuit board composite is therefore the same as in the case of "normal" monolithic printed circuit boards.

FIG. 9 shows the variant from FIG. 8, supplemented by a primary optical unit 30 and a holding frame 31 for the primary optical unit, assuming that the high-power component 19 is an LED arrangement. Due to the option of an exact z referencing (symbolized by the vertical arrows directed onto the surface regions 26a), it is possible to position the primary optical unit 30 highly precisely with respect to the high-power component 19 (LED arrangement).

FIG. 10 and FIG. 11 show the initial steps of a further, alternative method for producing an electronic module according to the invention in a standard SMT component placement line. This method variant in this case comprises the following steps:

Step 1: Providing a printed circuit board B with a placement side (top) and a fastening side 15 (bottom) facing away from the placement side 14 and providing an electronic component 19 (termed a high-power component 19 in the following) with specific requirements. The high-power component 19 may, as already mentioned previously, be an optoelectronic component, such as for example a laser diode, an LED, an LED arrangement, a photodiode or a DLP component.

Step 2: Placing (top-up) and fixing the electronic high-power component 19 on the placement side 15 of the printed circuit board B by means of reflow soldering. The high-power component 19 is additionally fixed by means of adhesive dots 18 on the printed circuit board B. This arrangement is illustrated in FIG. 10. Subsequently, the printed circuit board B populated with the high-power component 19 is turned.

Step 3: Providing a printed circuit board A, which has a first placement side 12 (*top*) and a second placement side 13 (bottom) facing away from the first placement side 12. The printed circuit board A has a recess 10 in the centre, as can be seen in FIG. 11. Furthermore, various electronic component elements 11 are provided for populating the printed circuit board A.

Step 4: Placing (top-up) and fixing electronic component elements 11 on the first placement side 12 of the printed circuit board A and subsequently turning the printed circuit board A.

Step 5: Placing (bottom-up) and fixing electronic component elements 11 on the second placement side 13 of the printed circuit board A and placing (bottom-up) and fixing the printed circuit board B, populated with the high-power component 19, from step 2 on the second placement side 13 of the printed circuit board A in an overlapping manner, to obtain a stepped printed circuit board composite, wherein the stepped printed circuit board composite is delimited at least in certain regions by end regions, which are formed by sections of the at least one printed circuit board A. In this case, as is illustrated in FIG. 11, a stepped printed circuit board composite is obtained from the printed circuit board A and the printed circuit board B, in which the recess 10 of the printed circuit board A is covered by the printed circuit board B. Due to the bottom-up placement of the printed circuit board B, the placement side 14 (printed circuit board B) faces the placement side 13 (printed circuit board A) or the recess 10; the fastening side 15 of printed circuit board B correspondingly faces away. The stepped printed circuit board composite is, as can be seen in FIG. 11, delimited by end regions 16, which are formed by sections of the printed circuit board A.

Step 6: Step 6 of this method variant corresponds to step 6 of the above-described other method variant and is shown in FIG. 4. Placing the populated and stepped printed circuit board composite obtained in the preceding steps (see structure in FIG. 11) onto a heat sink 20. This takes place in that the printed circuit board composite is fastened flat on a contact surface 21 of the heat sink 20 using the fastening side 15 of the printed circuit board B, so that the fastening side 15 rests on the contact surface 21 (cf. FIG. 4). The contact surface 21 of the heat sink 20 is dimensioned such and is positioned such that it extends laterally beyond the fastening side 15 of the printed circuit board B in each case in the direction of the end regions 16 formed by the sections of the printed circuit board A. In the illustration shown in FIG. 4, the contact surface 21 extends laterally essentially up to the outermost ends of the end regions 16. The contact surface 21 may also have indentations, so that the component elements fastened on the second placement side 13 of the printed circuit board A find space. The printed circuit board A has alignment holes 9, as is common, for lateral positioning of the individual component elements 11 and the high-power component 19. As can now be seen very well in FIG. 4, the end regions 16 of the printed circuit board A are suspended in the air and are therefore exposed to damage due to impacts or vibrations. The region of the end regions 16 at risk from vibrations and impacts is indicated by the dashed frames. According to the invention, support elements are now formed on the contact surface 21 of the heat sink 20 for mechanically supporting the end regions 16, which are formed by the sections of the printed circuit board A and at risk from impacts and vibrations, as a result of which an electronic module 40 with a hybrid printed circuit board according to the invention is obtained.

The various exemplary variants for support elements, which are shown in FIGS. 5-9 and described above in connection with the other method variant, are to be applied to this alternative method variant in an identical manner. Reference is made to the above description of the exemplary embodiments for support elements illustrated in FIGS. 5-9.

FIGS. 12-16 show various examples for the structure of a hybrid stepped printed circuit board composite as a constituent of an electronic module according to the invention. A hybrid stepped printed circuit board composite is, as is described in detail herein, obtained in that at least one printed circuit board of a first generic type (termed "printed circuit board A"; e.g. an FR4 printed circuit board), which if appropriate is populated on both sides, is populated in an overlapping manner with at least one printed circuit board of a second generic type (termed "printed circuit board B"; e.g. an IMS printed circuit board). The printed circuit board B is populated on a placement side 14 with an electronic component with specific requirements (termed a high-power component 19; e.g. an optoelectronic component such as an LED arrangement). The stepped printed circuit board composite, which is in each case illustrated in various variants in FIGS. 12-16, is subsequently placed on a heat sink, wherein a fastening side 15 of the printed circuit board B rests flat on a contact surface of the heat sink. According to the invention, the end regions 16 of the printed circuit board composite formed by sections of the at least one printed circuit board A are mechanically supported by support elements, which are formed on the contact surface of the heat sink (cf. FIG. 4); the exemplary printed circuit board composites shown in FIGS. 12-16 can be combined with the examples for support elements shown in FIGS. 5-9. The printed circuit board A is populated on both sides with electronic component elements 11 in the examples shown in FIGS. 12-16.

FIG. 12 shows a schematic illustration of an advantageous structure of a printed circuit board composite 100 of an electronic module according to the invention in two perspectives (from below and from above). The structure of the printed circuit board composite 100 illustrated in FIG. 12 shows a plan view of the printed circuit board composite described above in relation to the two production methods (cf. FIGS. 1-11) as a constituent of an electronic module 40. This variant comprises a printed circuit board A populated on both sides with component elements 11, having a recess 10 and a printed circuit board B. The recess 10 is essentially window-shaped and, in the example shown, has a rectangular shape. It will be clear to a person skilled in the art that the shape of the window-shaped recess 10 may be freely selectable and may assume a shape different from a rectangular shape, for example may be square, rectangular, quadrilateral, round, rounded, etc. In the practical implementation, the recess 10 is typically chosen to be rectangular or square however. The printed circuit board B is connected to the printed circuit board A in an overlapping manner such that the printed circuit board B completely covers the recess of the printed circuit board A. The printed circuit board B is further populated with a high-power component 19, which extends through the recess 10 in the printed circuit board A. In the variant shown in FIG. 12, a particularly mechanically stable electronic module is obtained. In addition, the printed circuit boards A and B forming the printed circuit board composite 100 may contact one another in a wide range of ways and enable complex designs and contacting. For example, the printed circuit board A (e.g. an FR4 printed circuit board) is populated with the printed circuit board B (e.g. an IMS printed circuit board) in such a manner that the printed circuit board B covers the window-shaped recess 10 and overlaps with the printed circuit board A along the boundary line of the recess 10. The high-power component 19 (e.g. an LED arrangement) arranged on the printed circuit board B is arranged and positioned in such a manner in this case, that it extends through the recess in the printed circuit board A (e.g. in the case of an LED arrangement fixed on the printed circuit board B, the LED shines through the recess in the printed circuit board A).

FIG. 13 shows a schematic illustration of a further structure of a printed circuit board composite 200 of an electronic module according to the invention in two perspectives (from below and from above). In contrast to the printed circuit board composite 100 shown in FIG. 12, the recess is U-shaped in the printed circuit board composite 200. The printed circuit board composite 200 constitutes a specific embodiment, which may be used in the case of specific designs.

FIG. 14 shows a schematic illustration of a further structure of a printed circuit board composite 300 of an electronic module according to the invention in two perspectives (from above and from below). In this variant, two mutually spaced printed circuit boards A are connected in an overlapping manner to a printed circuit board B, so that a printed circuit board composite 300, which is stepped in the longitudinal direction, with printed circuit boards A and B connected in a serially alternating manner, is obtained. The two printed circuit boards A are essentially arranged in one plane and the printed circuit board B is arranged in a further plane formed by the overlap. The end regions 16 of the printed circuit board composite 300 are formed by a section of a printed circuit board A which is at the end in each case.

FIG. 15 shows a schematic illustration of a printed circuit board composite 400 in a perspective view from above. The printed circuit board composite is a development of the printed circuit board composite 300 from FIG. 14, in which in total, three printed circuit boards A are connected in a serially alternating and overlapping manner to two printed circuit boards B. A printed circuit board composite 400, which is stepped in the longitudinal direction, with printed circuit boards A and B connected in a serially alternating manner, is obtained. The three printed circuit boards A are essentially arranged in one plane and the two printed circuit boards B are essentially arranged in a further plane formed by the overlap. The end regions 16 of the printed circuit board composite 400 are formed by a section of a printed circuit board A which is at the end in each case.

The printed circuit board composite 300 and the printed circuit board composite 400 constitute specific embodiments, which may be used in the case of specific designs.

FIG. 16 shows a schematic illustration of a printed circuit board composite 500 of an electronic module according to the invention in a perspective view and exploded form from above. The printed circuit board composite 500 illustrated in FIG. 16 constitutes a modification of the printed circuit board composite 100 shown in FIG. 12, with the difference that in the printed circuit board composite 500, the printed circuit board A provided with a window-shaped recess 10 and the printed circuit board B populated with the high-power component 19 can be contacted with one another in the overlap region 501 thereof by means of ball grid array (BGA) technology. BGA contacting technology is sufficiently well-known to a person skilled in the field and allows a higher number of connections and improved heat transport. The solder balls ("balls"; labelled with the reference number 502 in FIG. 16) used in BGA technology can in this case be applied in the manner known per se to contact pads, which are provided, on one of the printed circuit boards to be connected (here on the printed circuit board B). Alternatively, the solder balls can also be applied to the contact pads by application with a doctor blade of solder paste and subsequent melting in a reflow process, after which the soldering paste contracts during cooling to form solder balls. A further known method for applying solder balls is the individual application of prefabricated BGA solder balls onto the contact pads of the printed circuit board in a placement machine with the aid of mini nozzles.

The invention may be modified in any desired manner known to the person skilled in the art and is not limited to the embodiments shown. Also, individual aspects of the invention may be picked up and substantially combined with one another. What are important are the ideas upon which the invention is based, which may be realized by a person skilled in the art, upon considering this teaching, in myriad ways and be maintained as such in spite of that.

REFERENCE LIST

A Printed circuit board of a first generic type
B Printed circuit board of a second generic type
10 Recess
11 Component element 12 First placement side (top) of a printed circuit board A
13 Second placement side (bottom) of a printed circuit board A
14 Placement side (top) of a printed circuit board B
15 Fastening side (bottom) of a printed circuit board B
16 End region of a printed circuit board A
17 Soldering paste
18 Adhesive
19 High-power component
20 Heat sink
21 Contact surface of the heat sink
22 Alignment hole
23 Step on the heat sink
24 Washer-like step
25 Adhesive dot
26 Washer-like step
26a Surface region of the washer 26
30 Primary optical unit
31 Holding frame
40 Electronic module
100 Printed circuit board composite
200 Printed circuit board composite
300 Printed circuit board composite
400 Printed circuit board composite
500 Printed circuit board composite
501 Overlap region
502 BGA solder ball

The invention claimed is:

1. An electronic module (40) comprising at least one printed circuit board of a first generic type ("printed circuit board A"), if appropriate populated on both sides, which is populated in an overlapping manner with at least one printed circuit board of a second generic type ("printed circuit board B"), wherein the printed circuit board B is populated with at least one electronic component with specific requirements (19), and the printed circuit boards A and B, which are connected to one another, form a stepped printed circuit board composite (100, 200, 300, 400, 500), wherein the stepped printed circuit board composite is delimited, at least in certain regions, by end regions (16), which are formed by sections of the at least one printed circuit board A, and the stepped printed circuit board composite is placed on a heat sink (20), wherein a fastening side (15) of the at least one printed circuit board B rests flat on a contact surface (21) of the heat sink,
wherein the contact surface of the heat sink is dimensioned and positioned in such a manner that it extends at least partially laterally beyond the fastening side of the at least one printed circuit board B in each case in the direction of the end regions formed by the sections of the at least one printed circuit board A,
wherein support elements, for mechanically supporting the end regions formed by the sections of the at least one printed circuit board A, are constructed on the contact surface of the heat sink, and
wherein washers (24, 26) made from printed-circuit-board-B material are applied as the support elements on the contact surface of the heat sink in the region of the end regions of the printed circuit board composite formed by the sections of the at least one printed circuit board A, and the end regions of the printed circuit board composite sit on the washers and are supported by the washers, wherein the printed-circuit-board-B material for the washers is chosen from the same batch from which the printed-circuit-board-B material for the at least one printed circuit board B originates.

2. The electronic module according to claim 1, wherein the at least one printed circuit board A has at least one recess (10) and the at least one printed circuit board B is connected in an overlapping manner to the at least one printed circuit board A such that in each case, a printed circuit board B in each case covers a recess (10) of the printed circuit board A at least in certain regions.

3. The electronic module according to claim 2, wherein the at least one recess (10) is essentially window-shaped.

4. The electronic module according to claim 1, wherein the at least one printed circuit board A has alignment holes (22), and the washers (26) are positioned on the contact surface of the heat sink below the alignment holes of the at least one printed circuit board A, so that surface regions (26a) of the respective washers (26) are exposed by the alignment holes (22).

5. The electronic module according to claim 1, wherein the support elements are set up to dissipate thermal energy from the at least one printed circuit board A to the heat sink and/or to enable a potential equalization between the at least one printed circuit board A and the heat sink.

6. The electronic module according to claim 1, wherein the at least one printed circuit board A and the at least one printed circuit board B are contacted with one another in their overlap region (501) by means of ball grid array (BGA) technology.

7. An illumination device for a motor vehicle, particularly a motor-vehicle headlamp, comprising an electronic module (40) according to claim 1.

8. The use of an electronic module according to claim 1 in an illumination device for a motor vehicle.

9. A method for producing an electronic module in a component placement line, the electronic module comprising a stepped printed circuit board composite having at least one electronic component with specific requirements and a heat sink, wherein the method comprises:
populating at least one printed circuit board of a first generic type ("printed circuit board A"), if appropriate populated or to be populated on both sides, in an overlapping manner with at least one printed circuit board of a second generic type ("printed circuit board B"), wherein the printed circuit board B is populated with at least one electronic component with specific requirements, to obtain a stepped printed circuit board composite, wherein the stepped printed circuit board composite is delimited, at least in certain regions, by end regions, which are formed by sections of the at least one printed circuit board A, and
placing the stepped printed circuit board composite obtained onto the heat sink in such a manner that a fastening side of the at least one printed circuit board B rests flat on a contact surface of the heat sink, wherein the contact surface of the heat sink is dimensioned and positioned in such a manner that it extends at least partially laterally beyond the fastening side of the at least one printed circuit board B in each case in the direction of the end regions formed by sections of the at least one printed circuit board A, and wherein support elements, for mechanically supporting the end regions formed by the sections of the at least one printed circuit board A, are constructed on the contact surface of the heat sink,
wherein washers made from printed-circuit-board-B material are applied as the support elements on the contact surface of the heat sink in the region of the end regions of the printed circuit board composite formed by the sections of the at least one printed circuit board A, and the end regions of the printed circuit board composite sit on the washers and are supported by the washers, wherein the printed-circuit-board-B material for the washers is chosen from the same batch from which the printed-circuit-board-B material for the at least one printed circuit board B originates.

10. The method for producing an electronic module according to claim 9, wherein the method comprises the steps:
- a) providing at least one printed circuit board B with a placement side (top) and a fastening side (bottom), facing away from the placement side, and providing at least one electronic component with specific requirements,
- b) placing (top-up) and fixing the at least one electronic component with specific requirements on the placement side of the at least one printed circuit board B and subsequently turning the printed circuit board B,
- c) providing at least one printed circuit board A with a first placement side (top) and a second placement side (bottom), facing away from the first placement side, and providing electronic component elements,
- d) placing (top-up) and fixing electronic component elements on the first placement side of the at least one printed circuit board A and subsequently turning the printed circuit board A,
- e) placing (bottom-up) and fixing electronic component elements on the second placement side of the at least one printed circuit board A and placing (bottom-up) and fixing the at least one populated printed circuit board B from step b) on the second placement side of the at least one printed circuit board A in an overlapping manner, to obtain a stepped printed circuit board composite, wherein the stepped printed circuit board composite is delimited at least in certain regions by end regions, which are formed by sections of the at least one printed circuit board A, and
- f) placing the stepped printed circuit board composite obtained onto the heat sink in such a manner that the fastening side of the at least one printed circuit board B rests flat on a contact surface of the heat sink, wherein the contact surface of the heat sink is dimensioned and positioned in such a manner that it extends at least partially laterally beyond the fastening side of the at least one printed circuit board B in each case in the direction of the end regions formed by the sections of the at least one printed circuit board A, and support elements, for mechanically supporting the end regions formed by the sections of the at least one printed circuit board A, are constructed on the contact surface of the heat sink.

11. The method for producing an electronic module according to claim 9, wherein the method comprises the steps:
- g) providing at least one printed circuit board A with a first placement side (top) and a second placement side (bottom), facing away from the first placement side, and providing electronic component elements,
- h) placing (bottom-up) and fixing electronic component elements on the second placement side of the at least one printed circuit board A,
- i) providing at least one printed circuit board B with a placement side (top) and a fastening side (bottom), facing away from the placement side,
- j) placing (bottom-up) and fixing the at least one printed circuit board B on the second placement side of the at least one printed circuit board A in an overlapping manner, to obtain a stepped printed circuit board composite, wherein the stepped printed circuit board composite is delimited at least in certain regions by end regions, which are formed by sections of the at least one printed circuit board A, and subsequently turning the stepped printed circuit board composite,
- k) placing (top-up) and fixing at least one provided electronic component with specific requirements on the placement side of the at least one printed circuit board B and electronic component elements on the first placement side of the at least one printed circuit board B of the stepped printed circuit board composite from step j), to obtain a stepped printed circuit board composite populated on both sides, and
- l) placing the stepped printed circuit board composite obtained onto the heat sink in such a manner that the fastening side of the at least one printed circuit board B rests flat on a contact surface of the heat sink, wherein the contact surface of the heat sink is dimensioned and positioned in such a manner that it extends at least partially laterally beyond the fastening side of the at least one printed circuit board B in each case in the direction of the end regions formed by the sections of the at least one printed circuit board A, and support elements, for mechanically supporting the end regions formed by the sections of the at least one printed circuit board A, are constructed on the contact surface of the heat sink.

12. The method according to claim 11, wherein in step k), the positioning of the at least one electronic component with specific requirements on the printed circuit board B takes place with the aid of reference marks positioned on the at least one printed circuit board A.

13. An electronic module (40) produced according to claim 9.

* * * * *